United States Patent
Chen

(10) Patent No.: US 7,913,747 B2
(45) Date of Patent: Mar. 29, 2011

(54) MINIATURE LIQUID COOLING DEVICE WITH TWO SETS OF ELECTRODES CROSSED OVER ONE ANOTHER TO DRIVE A FLUID

(75) Inventor: Yen-Chih Chen, Taipei Hsien (TW)

(73) Assignee: Foxconn Technology Co., Ltd., Tu-Cheng, New Taipei (TW)

( * ) Notice: Subject to any disclaimer, the term of this patent is extended or adjusted under 35 U.S.C. 154(b) by 775 days.

(21) Appl. No.: 11/955,290

(22) Filed: Dec. 12, 2007

(65) Prior Publication Data

US 2009/0050300 A1 Feb. 26, 2009

(30) Foreign Application Priority Data

Aug. 24, 2007 (CN) .......................... 2007 1 0076562

(51) Int. Cl.
| F28D 15/00 | (2006.01) |
| F28F 7/00 | (2006.01) |
| H05K 7/20 | (2006.01) |
| F04B 37/02 | (2006.01) |
| F04F 99/00 | (2009.01) |
| H02K 44/00 | (2006.01) |
| H02K 44/08 | (2006.01) |

(52) U.S. Cl. ............. 165/80.4; 165/104.23; 165/104.28; 361/695; 361/699; 417/48; 417/50

(58) Field of Classification Search ............. 165/104.23, 165/104.28, 80.4; 361/699; 417/48, 50
See application file for complete search history.

(56) References Cited

U.S. PATENT DOCUMENTS

| 5,043,579 A * | 8/1991 | Gundlach et al. ............. 250/325 |
| 5,706,162 A * | 1/1998 | Bergen et al. ................. 361/230 |
| 5,769,155 A * | 6/1998 | Ohadi et al. ............... 165/109.1 |
| 6,203,683 B1 * | 3/2001 | Austin et al. .................. 204/547 |
| 6,374,909 B1 * | 4/2002 | Jeter et al. ........................ 165/96 |
| 6,443,704 B1 * | 9/2002 | Darabi et al. .................... 417/50 |
| 6,888,721 B1 * | 5/2005 | Moghaddam et al. ........ 361/700 |
| 6,890,409 B2 * | 5/2005 | Woudenberg et al. ........ 204/242 |
| 7,108,056 B1 * | 9/2006 | Moghaddam et al. ........ 165/201 |
| 7,149,085 B2 * | 12/2006 | Chebiam et al. .............. 361/699 |
| 7,261,824 B2 * | 8/2007 | Schlautmann et al. ........... 216/2 |
| 7,316,543 B2 * | 1/2008 | Goodson et al. ................ 417/50 |
| 7,679,910 B2 * | 3/2010 | Chen .............................. 361/700 |
| 7,766,457 B2 * | 8/2010 | Chen .............................. 347/55 |
| 2004/0120827 A1 * | 6/2004 | Kim et al. ........................ 417/48 |
| 2005/0139996 A1 * | 6/2005 | Myers et al. .................... 257/712 |
| 2009/0196765 A1 * | 8/2009 | Dyer et al. ....................... 417/48 |

* cited by examiner

Primary Examiner — Cheryl J Tyler
Assistant Examiner — Brandon M Rosati
(74) Attorney, Agent, or Firm — Jeffrey T. Knapp

(57) ABSTRACT

A miniaturized liquid cooling device (200) includes at least a heat absorber (20), at least a heat dissipater (30), a droplet generator (40) driving a working fluid circulating between the at least a heat absorber and the at least a heat dissipater, and a plurality of tubes (50) connecting the at least a heat absorber, the at least a heat dissipater and the droplet generator together to form a loop. The droplet generator includes an array of control electrodes (422) and an array of reference electrodes (442) crossed over the array of control electrodes. A plurality of superposed areas (45) are formed between the control electrodes and the reference electrodes. Voltages are regularly applied on the superposed areas for dividing the working fluid into fluid droplets when the working fluid flows through the droplet generator.

9 Claims, 15 Drawing Sheets

US 7,913,747 B2

MINIATURE LIQUID COOLING DEVICE WITH TWO SETS OF ELECTRODES CROSSED OVER ONE ANOTHER TO DRIVE A FLUID

CROSS-REFERENCE TO RELATED APPLICATIONS

This application is related to co-pending U.S. patent application Ser. No. 11/836,734, filed on Aug. 9, 2007, and entitled "INK-JET HEAD AND PRINTER USING THE SAME"; and co-pending U.S. patent application Ser. No. 11/843,570, filed on Aug. 22, 2007, and entitled "MINIATURIZED LIQUID COOLING DEVICE"; and co-pending U.S. patent application entitled "MINIATURIZED LIQUID COOLING DEVICE HAVING DROPLET GENERATOR AND PIZEOELECTRIC MICROPUMP" and filed on the same day as the instant application. The co-pending U.S. patent applications are assigned to the same assignee as the instant application. The disclosures of the above-identified applications are incorporated herein by reference.

BACKGROUND OF THE INVENTION

1. Field of the Invention

The present invention relates generally to liquid cooling devices, and more particularly to a miniaturized liquid cooling device and a droplet generator used in the miniaturized liquid cooling device.

2. Description of Related Art

Along with fast developments in electronic information industries, electronic components such as central processing units (CPUs) of computers are capable of operating at a much higher frequencies and speeds. As a result, the heat generated by the CPUs during normal operation is commensurately increased. If not quickly removed away from the CPUs this generated heat may cause them to become overheated and finally affect the workability and stability of the CPUs.

In order to remove the heat of the CPUs and hence keep the CPUs in normal working order, cooling devices must be provided to the CPUs to dissipate heat therefrom. Conventionally, extruded heat sinks combined with electric fans are frequently used for this heat dissipation purpose. These conventional cooling devices are sufficient for CPUs with low frequencies, but are unsatisfactory for cooling the current CPUs with high frequencies. Liquid cooling devices with high heat dissipation efficiencies are used for dissipating heat generated by high frequency CPUs.

The liquid cooling device includes a heat absorber absorbing heat from the CPU, a heat dissipater dissipating the heat to surrounding environment, a pump driving working fluid to circulate between the heat absorber and the heat dissipater, and a plurality of tubes connecting the heat absorber and the heat dissipater. The liquid cooling device satisfies the heat dissipation requirements of the high frequency CPU. However, the pump occupies a large volume, which increases the size of the liquid cooling device. This goes against the need for compact size in electronic products. Therefore, there is a need for a miniaturized liquid cooling device.

SUMMARY OF THE INVENTION

The present invention relates, in one aspect, to a miniaturized liquid cooling device. The miniaturized liquid cooling device includes at least a heat absorber, at least a heat dissipater, a droplet generator driving a working fluid to circulate between the at least a heat absorber and the at least a heat dissipater, and a plurality of tubes connecting the at least a heat absorber, the at least a heat dissipater and the droplet generator together to form a loop. The droplet generator includes an array of control electrodes and an array of reference electrodes crossed over the array of control electrodes. A plurality of superposed areas are formed between the control electrodes and the reference electrodes. Voltages are regularly applied on the superposed areas for dividing the working fluid into fluid droplets when the working fluid flows through the droplet generator.

The present invention relates, in another aspect, to a droplet generator used in the miniaturized liquid cooling device to cool at least a heat generating electronic component. The liquid cooling device has at least a heat absorber for thermally connecting with the at least a heat generating electronic component and at least a heat dissipater for dissipating heat generated by the at least a heat generating electronic component. The droplet generator is disposed between and communicates with the at least a heat absorber and the at least a heat dissipater for driving a working fluid to circulate in the liquid cooling device. The droplet generator includes a first electrode plate, a second electrode plate hermetically covering the first electrode plate, and a fluid channel formed between the second electrode plate and the first electrode plate. The fluid channel has outer openings at opposite ends thereof for respectively connecting with the at least a heat absorber and the at least a heat dissipater. The first electrode plate has an array of control electrodes disposed thereon. The second electrode plate has an array of reference electrodes crossed over the array of control electrodes. A plurality of superposed areas are formed between the control electrodes and the reference electrodes. Voltages are regularly applied on the superposed areas for generating a plurality of fluid droplets and driving the fluid droplets to move along the fluid channel between the outer openings of the opposite ends of the droplet generator.

Other advantages and novel features of the present invention will become more apparent from the following detailed description of preferred embodiments when taken in conjunction with the accompanying drawings, in which:

DETAILED DESCRIPTION OF THE INVENTION

Figure 1:
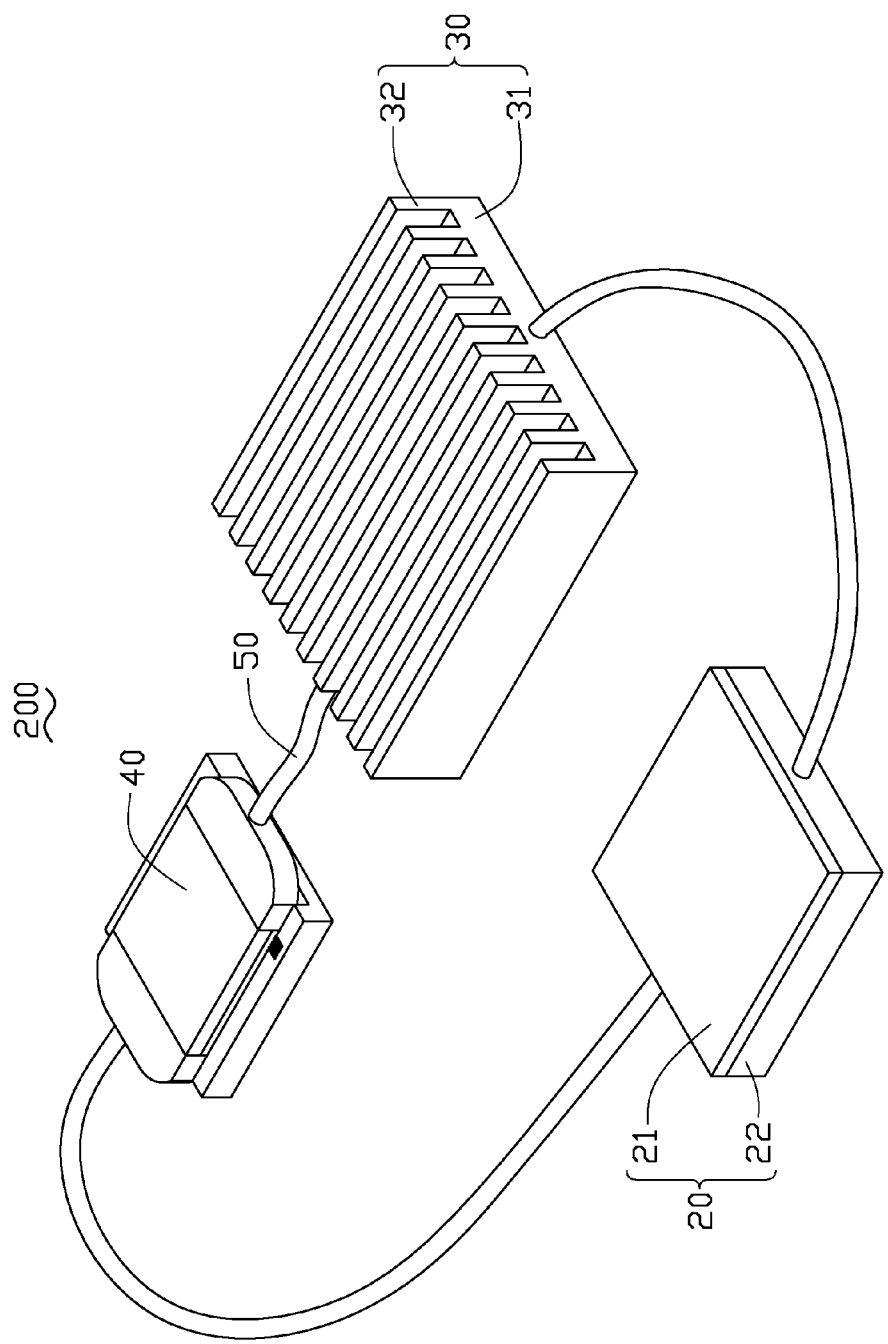
FIG. 1 is an assembled view of a miniaturized liquid cooling device in accordance with a preferred embodiment of the present invention.

Reference will now be made to the drawing figures to describe the preferred embodiment in detail.

Figure 2:
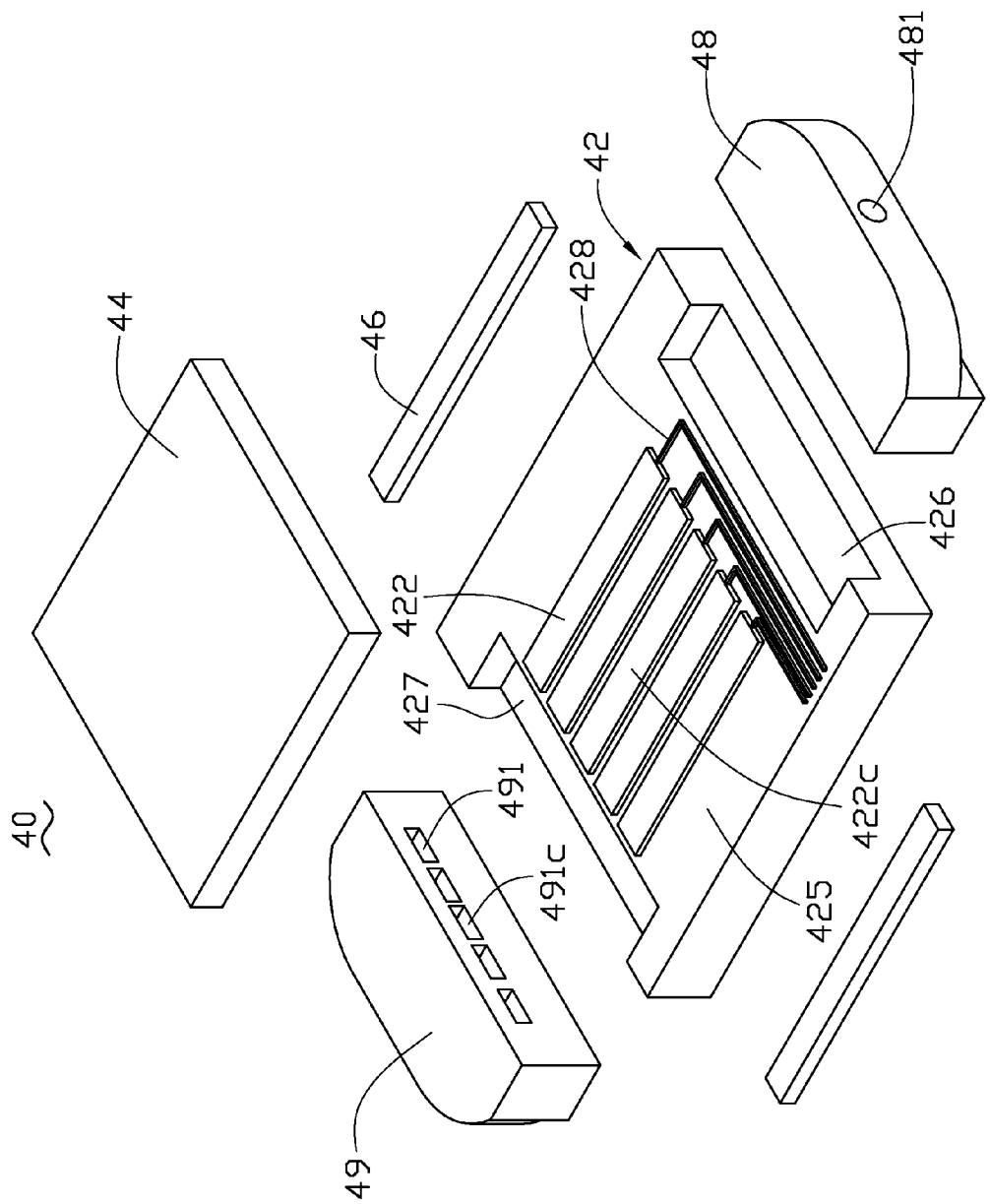
FIG. 2 is an exploded, isometric view of a droplet generator of the miniaturized liquid cooling device of FIG. 1.

Referring to FIGS. 1 and 2, a miniaturized liquid cooling device 200 according to a preferred embodiment of the present invention is shown. The liquid cooling device 200 includes a heat absorber 20, a heat dissipater 30, a miniaturized droplet generator 40 and a plurality of tubes 50. The heat absorber 20, the heat dissipater 30 and the droplet generator 40 connect with each other via the tubes 50 in such a way that a loop containing a working fluid is formed.

The heat absorber 20 thermally connects with a heat generating electronic component (not shown). The working fluid in the heat absorber 20 absorbs heat from the heat generating electronic component and is therefore heated. The droplet generator 40 drives the heated working fluid to flow towards the heat dissipater 30. The heated working fluid is cooled at the heat dissipater 30 and driven to flow back to the heat absorber 20 to form a circulation.

The heat absorber 20 is a rectangular shaped heat absorbing block. The heat absorber 20 includes a bottom base 22 defining a fluid passage (not shown) therein and a top cover 21 covering the bottom base 22. Inlet and outlet of the fluid passage respectively connect with the droplet generator 40 and the heat dissipater 30 via the tubes 50.

The heat dissipater 30 is a heat sink including a base 31 and a plurality of fins 32 extending upwardly from the base 31. The base 31 of the heat dissipater 30 defines a fluid passage (not shown) therein. Inlet and outlet of the fluid passage respectively connect with the heat absorber 20 and the droplet generator 40 via the tubes 50. A plurality of heat dissipating posts may be arranged in the fluid passage of the heat dissipater 30 for increasing heat exchange efficiency between the heat dissipater 30 and the working fluid.

Figure 4:
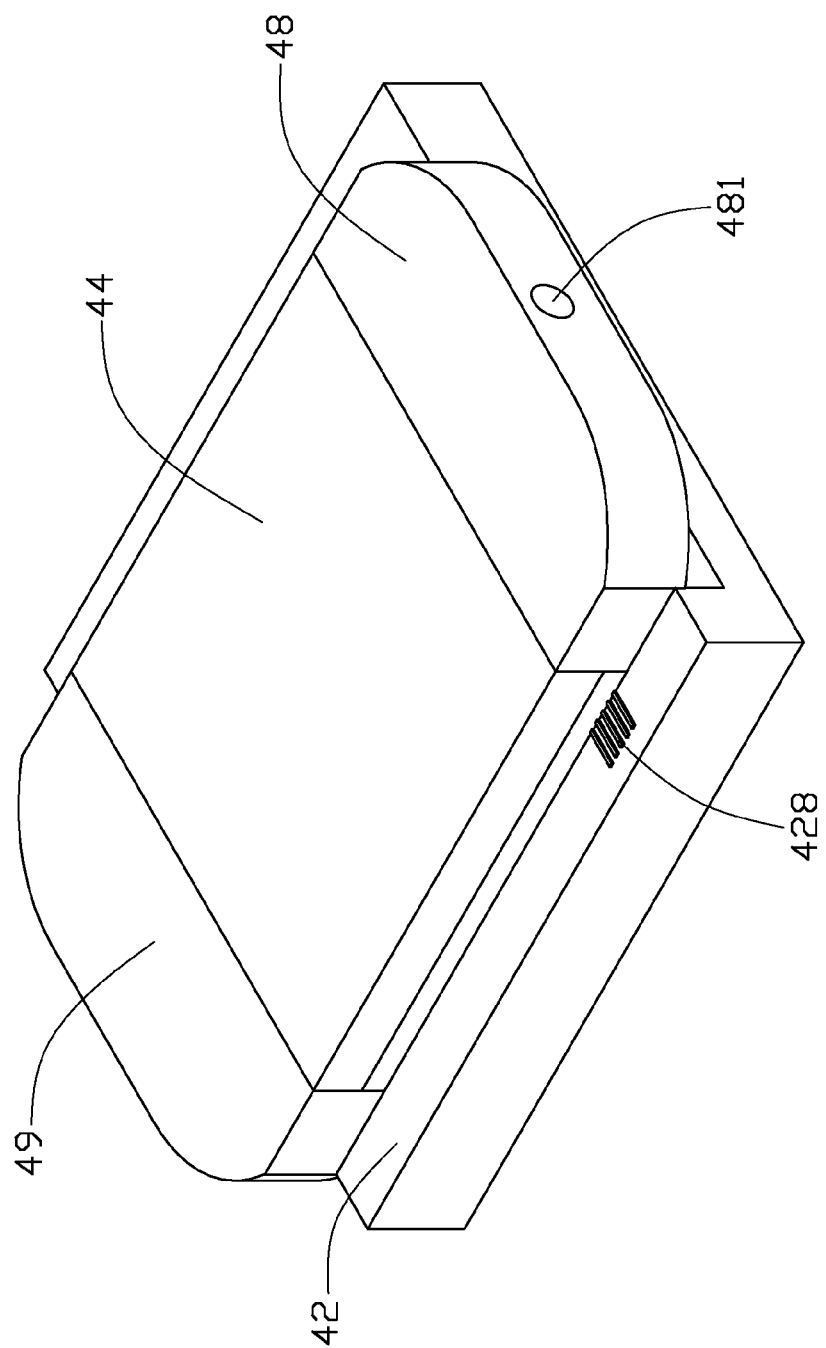
FIG. 4 is an assembled view of the droplet generator of FIG. 2.

Referring to FIGS. 2 and 4, the droplet generator 40 includes a bottom electrode plate 42, a top electrode plate 44 hermetically covering the bottom electrode plate 42, a control circuit (not shown) electrically connecting the bottom electrode plate 42 with the top electrode plate 44, two elongated supporting members 46 sandwiched between the top electrode plate 44 and the bottom electrode plate 42, and first and second sealing blocks 48, 49 sealing two opposite ends of a space formed between the top and the bottom electrode plates 44, 42 and the supporting members 46.

The bottom electrode plate 42 is rectangular shaped in profile and defines first and second openings 426, 427 at two opposite ends thereof. The first and the second sealing blocks 48, 49 are respectively received in the first and the second openings 426, 427, and seal the two opposite sides of the bottom electrode plate 42. The first sealing block 48 defines an entrance 481 for the droplet generator 40, whilst the second sealing block 48 defines an exit 491 for the droplet generator 40. The entrance 481 of the droplet generator 40 has a round outer opening, five spaced rectangular inner openings (not shown), and a fluid storage chamber (not shown) communicating the outer opening with the inner openings. The exit 491 of the droplet generator 40 has five spaced rectangular inner openings 491c, a round outer opening (not shown) and a fluid storage chamber (not shown) communicating the inner openings 491c with the outer opening. An array of control electrodes 422 including five spaced and parallel control electrodes 422 are arranged on a top surface 425 of the bottom electrode plate 42 along a direction from a front side towards a rear side thereof. Each of the control electrodes 422 extends from one inner opening of entrance 481 of the droplet generator 40 towards a corresponding inner opening 491c of the exit 491 of the droplet generator 40. That is, each of the control electrodes 422 extends from a right side towards a left side of the bottom electrode plate 42.

Figure 3:
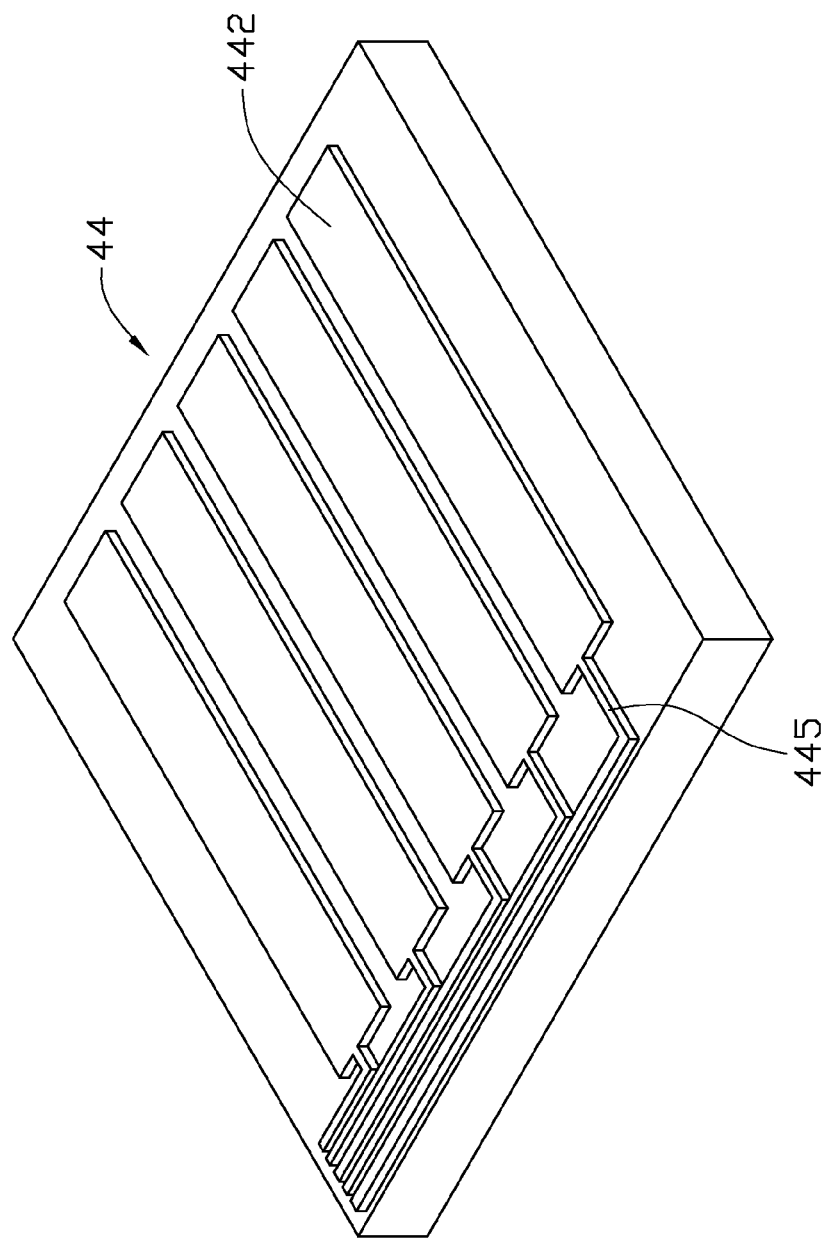
FIG. 3 is an isometric view of a top electrode plate of the droplet generator of FIG. 2, the top electrode plate being turned over inwardly with respect to its direction of FIG. 2.

Referring to FIG. 3, an array of reference electrodes 442 including five spaced and parallel reference electrodes 442 are arranged on a bottom surface of the top electrode plate 44. The reference electrodes 442 are arranged along a direction from a left side towards a right side of the top electrode plate 44. Each of the reference electrodes 442 extends from a rear side towards a front side of the top electrode plate 44. Referring to FIG. 6, when the top electrode plate 44 covers on the bottom electrode plate 42, the reference electrodes 442 of the top electrode plate 44 are disposed above and perpendicular to the control electrodes 422 of the bottom electrode plate 42. That is, the reference electrodes 442 of the top electrode plate 44 are crisscrossed over the control electrodes 422 of the bottom electrode plate 42. A plurality of superposed areas 45 are formed between the control electrodes 422 of the bottom electrode plate 42 and the reference electrodes 442 of the top electrode plate 44. Each of the control electrodes 422 and the reference electrodes 442 connects with the control circuit via a connecting unit 428, 445. When the top electrode plate 44 covers on the bottom electrode plate 42, the bottom surface of the top electrode plate 44 spaces a distance from the top surface 425 of the bottom electrode plate 42. A fluid channel including five sub-channels 43 (shown in FIG. 5) is formed between the top electrode plate 44 and the bottom electrode plate 42 and extends along extension directions of the control electrodes 422.

Figure 5:
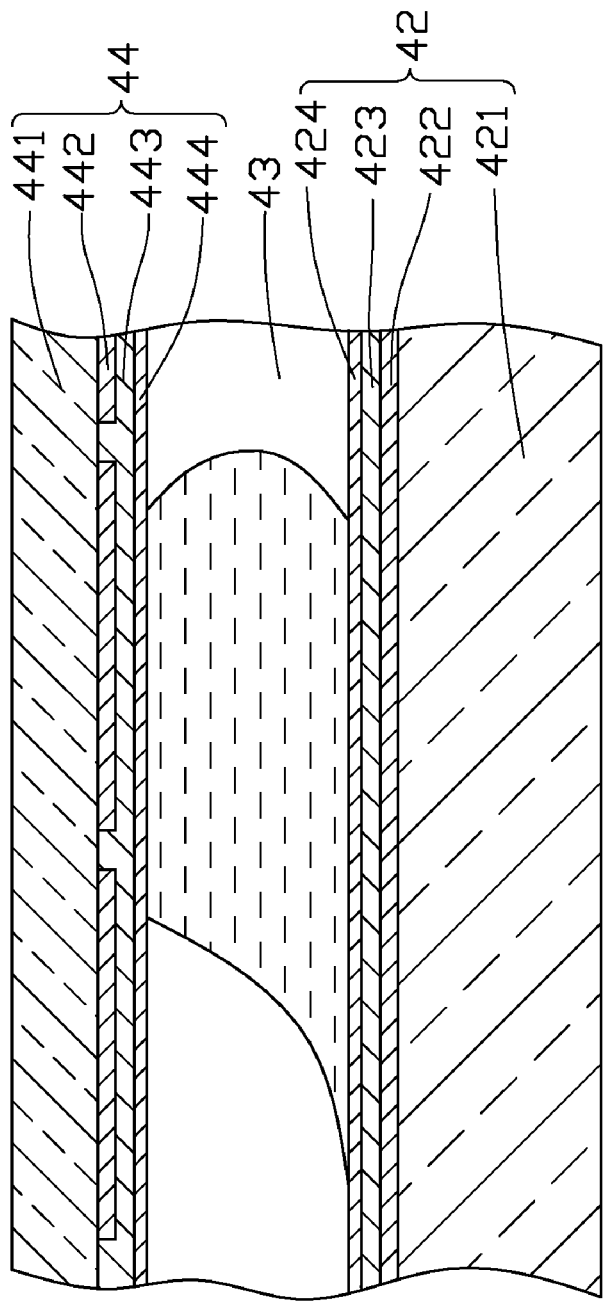
FIG. 5 is a part of a cut-away view of the droplet generator of FIG. 4, showing the part corresponding to a fluid channel of the droplet generator.
Figure 6:
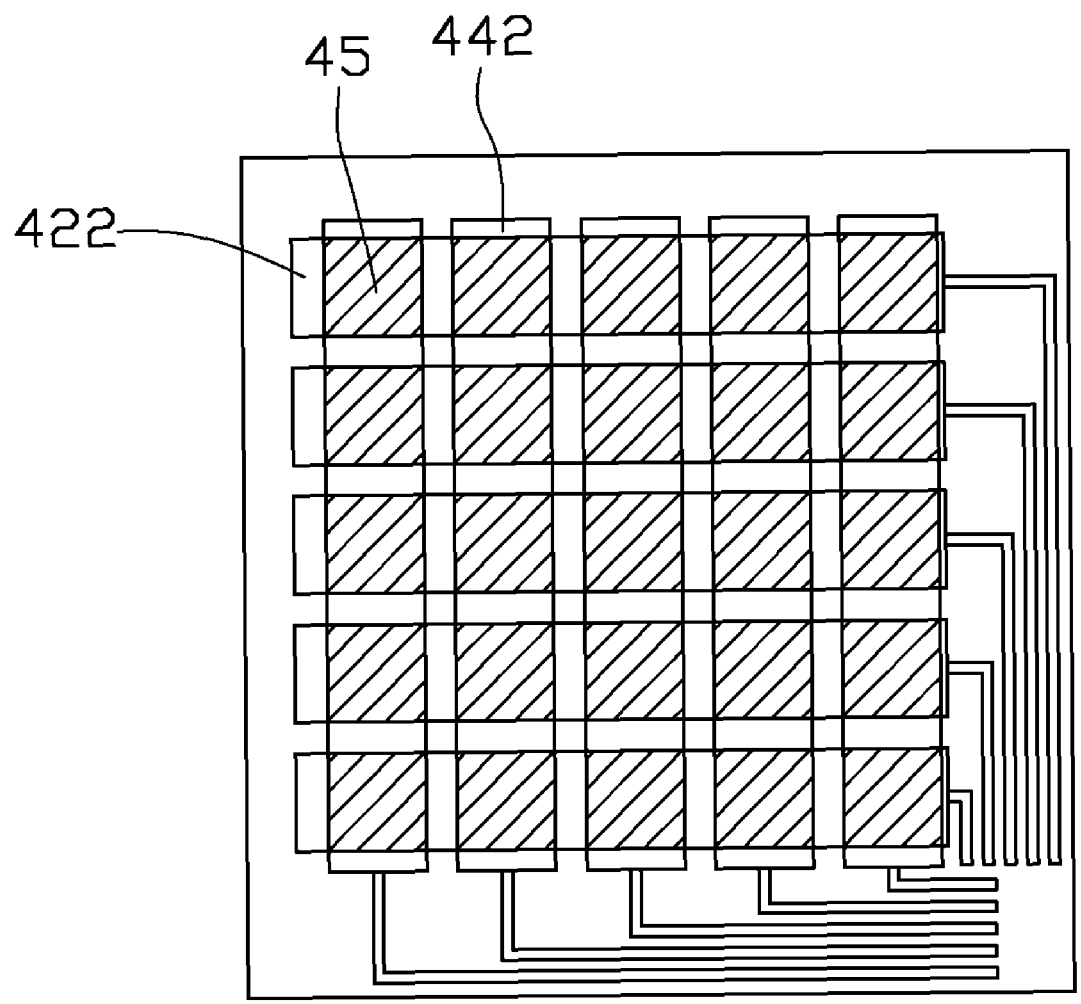
FIG. 6 is an explanatory view showing position relations between control electrodes of a bottom electrode plate and reference electrodes of the top electrode plate of the droplet generator of FIG. 4.

Referring to FIG. 5, as viewed from the cut-away view, the bottom electrode plate 42 includes a substrate 421 made of glass. Alternatively, the substrate 421 can be made of silicone. The first and the second openings 426, 427 are defined in the substrate 421 via mechanic manufacturing or wet etching method. A conductive and transparent ITO (indium tin oxide) glass layer is deposited on a top surface of the substrate 421 via chemical vapor deposition. The ITO glass layer is etched via photochemical etching so as to form the control electrodes 422 and the connecting units 428. A dielectric layer 423 made of silicone nitride ($Si_3N_4$) is deposited on top surfaces of the control electrodes 422 and the connecting units 428 via chemical vapor deposition method. A hydrophobic layer 424 made of Teflon is coated on the dielectric layer 423 via spin coating method, so that the working fluid cannot permeate to wet the control electrodes 422.

The top electrode plate 44 is rectangular shaped in profile and includes a substrate 441 made of glass. Alternatively, the substrate 441 can be made of silicone. A conductive and transparent ITO (indium tin oxide) glass layer is deposited on a bottom surface of the substrate 441 via chemical vapor deposition. The ITO glass layer is etched via photochemical etching so as to form the reference electrodes 442 and the connecting units 445. A dielectric layer 443 made of silicone nitride ($Si_3N_4$) is deposited on bottom surfaces of the reference electrodes 442 and the connecting units 445 via chemical vapor deposition method. A hydrophobic layer 444 made of Teflon is coated on the dielectric layer 443 via spin coating method, so that the working fluid cannot permeate to wet the reference electrodes 442.

Figure 7A:
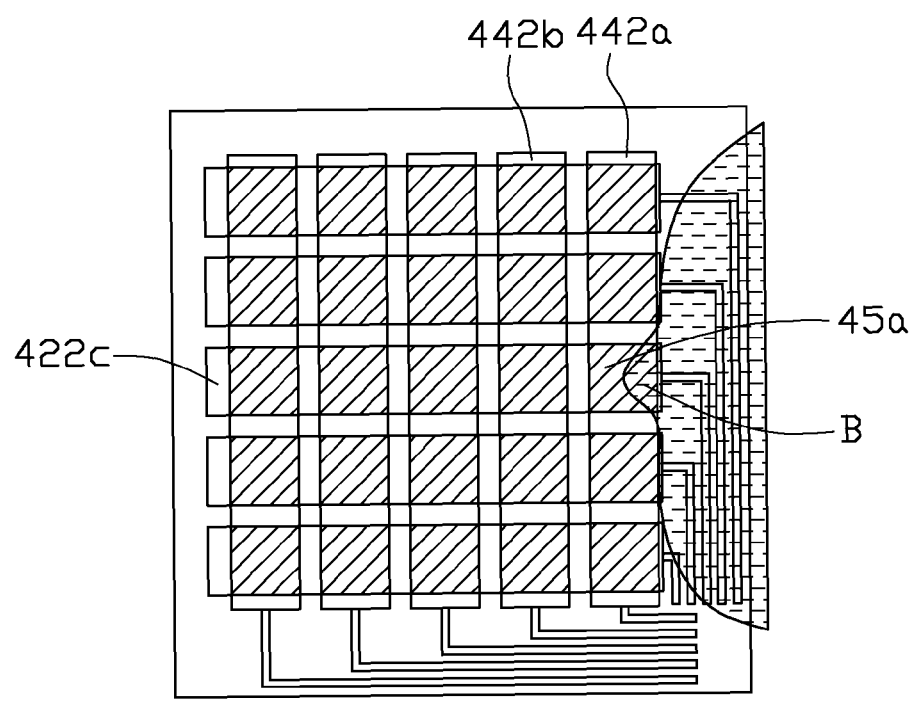
FIGS. 7A-7E are explanation views showing generation and movement of a fluid droplet.
Figure 7B:
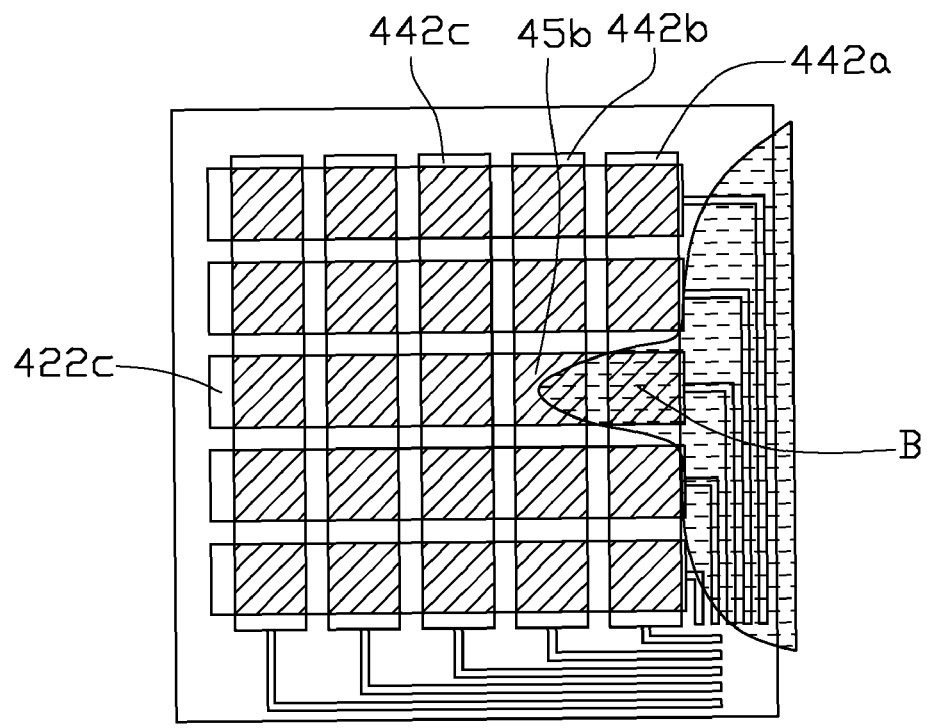
Figure 7C:
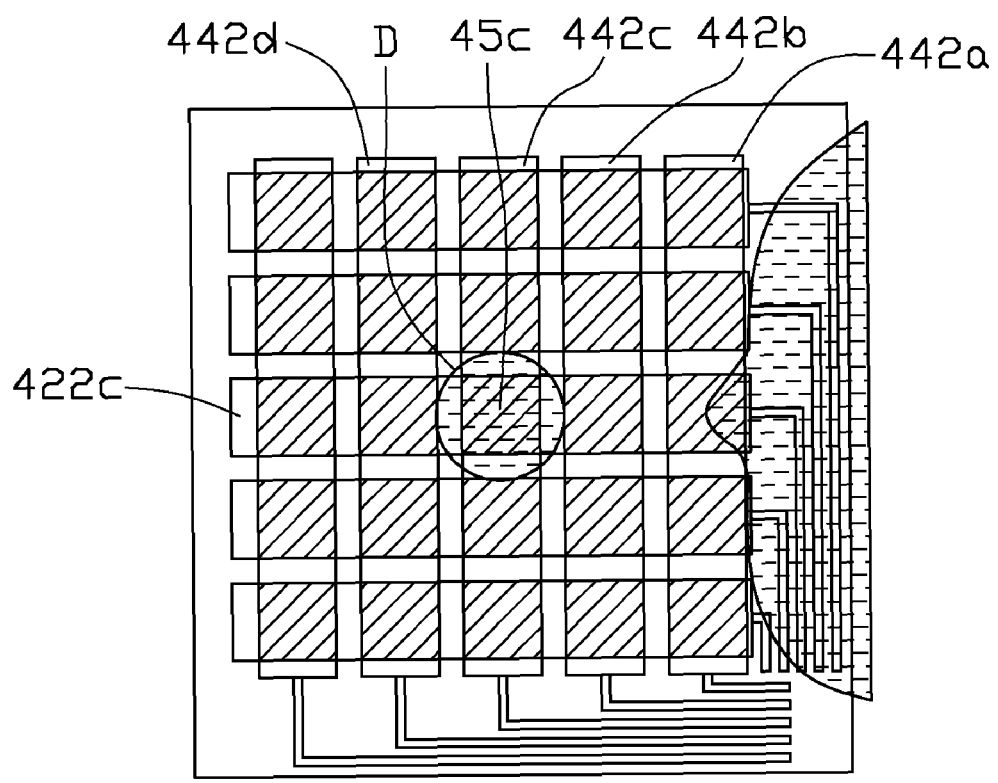
Figure 10A:
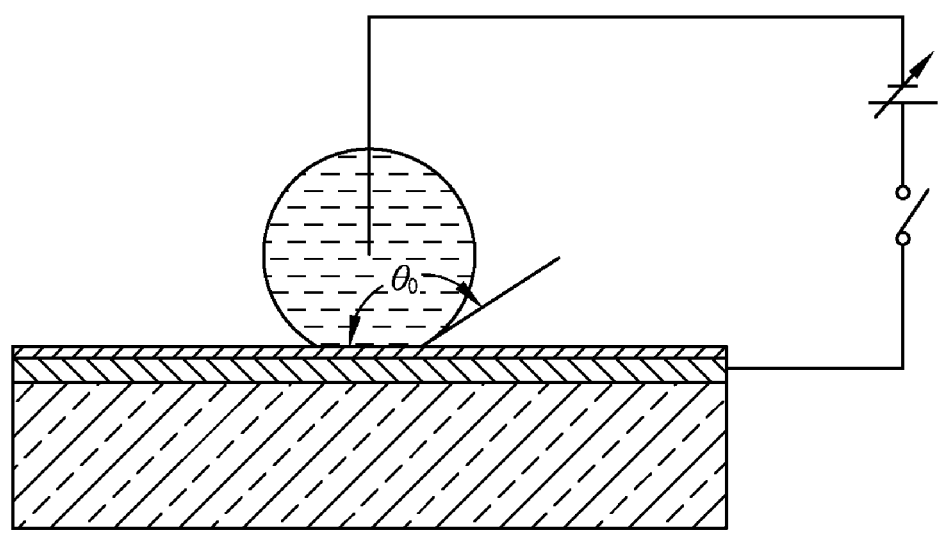
FIGS. 10A-10B are explanation views showing a principle of an EWOD efficiency.
Figure 10B:
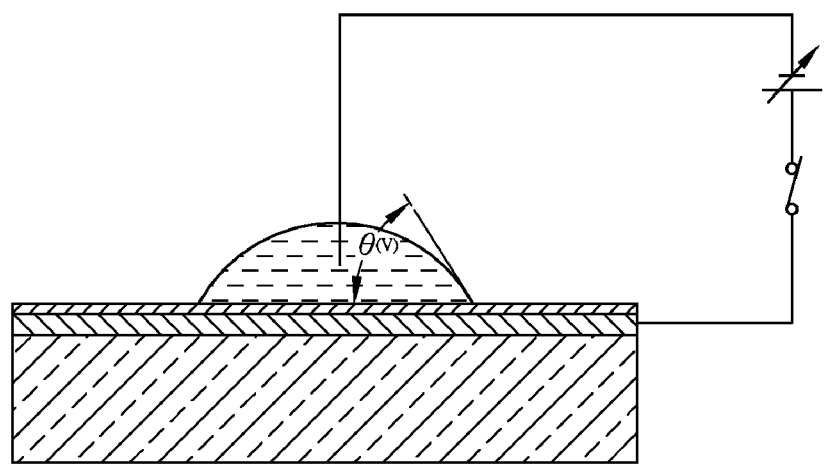

Referring to FIGS. 7A to 7C, during operation of the droplet generator 40, a left side of a fluid segment B arrives at a superposed area 45a between the control electrode 422c and the reference electrode 442a. A voltage is applied to the control electrode 422c and the reference electrode 442a by the control circuit. Therefore, the surface tension of the left side of the fluid segment B varies due to EWOD (electrowetting-on-dielectric) effect. Referring to FIGS. 10A and 10B, the EWOD effect is a phenomenon where a contact angle $\theta_0$ of a left or a right side of a fluid segment or a fluid droplet varies to a contact angle $\theta_{(v)}$ when a voltage is applied on the left or the right side of the fluid droplet, whilst a contact angle of the other side of the fluid segment/the fluid droplet remains as before. Therefore, the contact angles of the left and right sides of the fluid segment/the fluid droplet are different from each other, which causes a difference between surface tensions of the left and right sides of the fluid droplet/ fluid segment to be generated. The difference between the surface tensions drives the fluid segment to move towards a place having higher voltage. That is, the fluid segment B moves from the entrance 481 towards the superposed area 45a between the control electrode 422c and the reference electrode 442a. When a left side of the fluid segment B moves under the reference electrode 442b, a voltage from the control circuit is applied to the control electrode 422c and the reference electrode 442b. The fluid segment B moves from the superposed area 45a between the control electrode 422c and the reference electrode 442a towards a superposed area 45b between the control electrode 422c and the reference electrode 442b as shown in FIG. 7B. When the left side of the fluid segment B moves under the reference electrode 442c, a voltage from the control circuit is applied to the control electrode 422c and the reference electrode 442c, and the voltage applied to the control electrode 422c and the reference electrode 442b is cut off. At this time, the left side of the fluid segment B is driven to move towards a superposed area 45c between the control electrode 422c and the reference electrode 442c, whilst a right side of the fluid segment B is driven to move towards the superposed area 45a between the control electrode 422c and the reference electrode 442a. The fluid segment B is cut into two parts and the fluid droplet D is generated as shown in FIG. 7C.

Figure 7D:
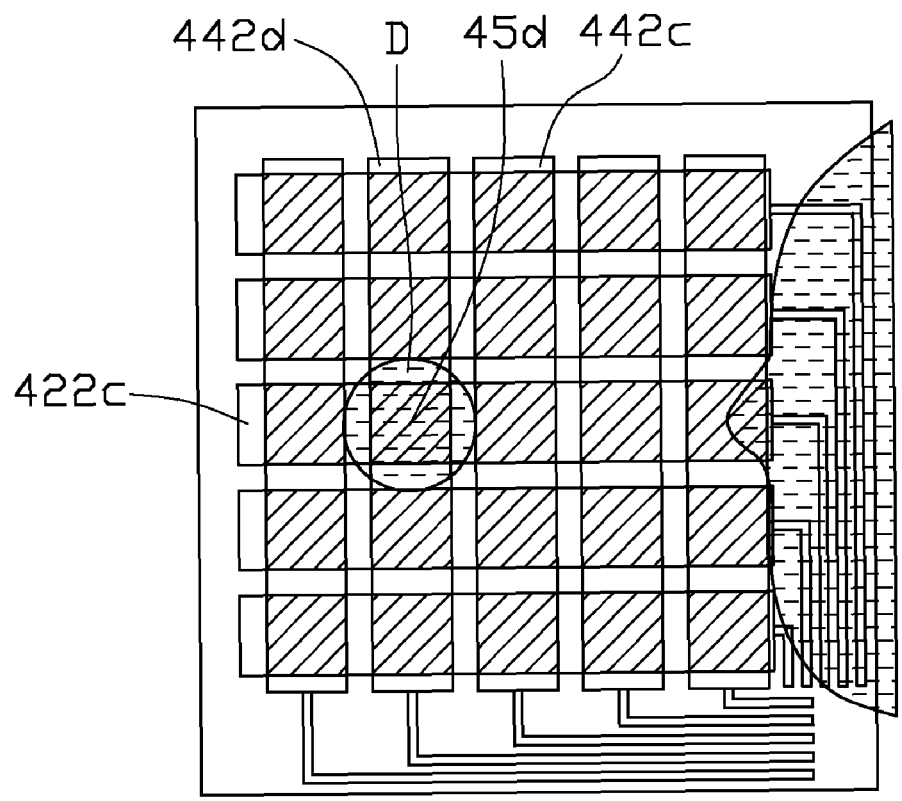
Figure 7E:
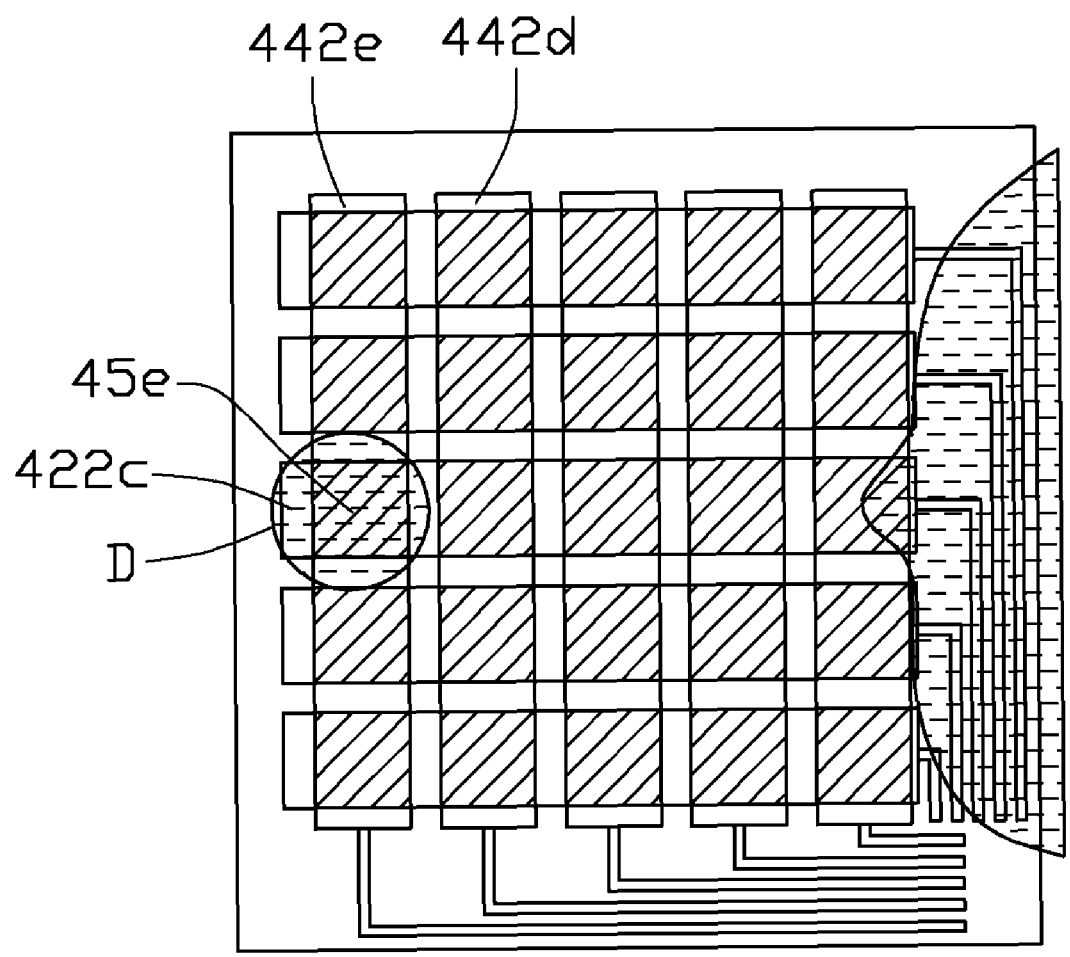

Referring to FIG. 7D to 7E, the fluid droplet D continues to move towards the superposed area 45c between the control electrode 422c and the reference electrode 442c. When a left side of the fluid droplet D moves under the reference electrode 442d, a voltage from the control circuit is applied to the control electrode 422c and the reference electrode 442d, and the voltage applied to the control electrode 422c and the reference electrode 442c is cut off. The fluid droplet D is driven to move towards the reference electrode 442d. When the left side of the fluid droplet D moves under the reference electrode 442e, a voltage from the control circuit is applied to the control electrode 422c and the reference electrode 442e, and the voltage applied to the control electrode 422c and the reference electrode 442d is cut off. The fluid droplet D continues to move towards the reference electrode 442e. The voltage is regularly applied to the control electrodes 422c and the reference electrode 442d, 442e and regularly cut off from the control electrodes 442c, 442d in that order. The fluid droplet D is driven to move from the right side towards the left side of the sub-channel 43 corresponding to the control electrode 422c and enters into the rectangular opening 491c of the exit 491 of the second sealing block 49. Hereinabove description merely shows a movement of one fluid droplet D in one sub-channel 43, actually, there are many more fluid droplets D moving in more sub-channels 43 at the same time, so that there is many more fluid droplets D continuously entering into the exit 491 of the second sealing block 49. In order to prevent the fluid droplets D (working fluid) from flowing back to the sub-channels 43, there are five check valves (not shown) disposed in the inner openings 491c of the exit 491.

When there is enough working fluid in the fluid storage chamber of the exit 491 of the second sealing block 49, the working fluid is pressed out of the droplet generator 40 and moves towards the heat absorber 20. The working fluid absorbs heat at the heat absorber 20 and is driven towards the heat dissipater 30 to dissipate the heat. Then, the working fluid returns to the droplet generator 40 and circulates in the liquid cooling device 200 to continuously absorb heat from the heat absorber 20 and dissipate the heat to the surrounding environment. Therefore, the heat generated from the heat generating electronic component is dissipated.

In the present liquid cooling device 200, the droplet generator 40 functions as the pump of the liquid cooling device 200 and drives the working fluid to circulate in the liquid cooling device 200. The droplet generator 40 occupies a small size, which decreases the size of the entire liquid cooling device 200 in such a way that the liquid cooling device 200 can be used in compact electronic products such as laptop computers. The droplet generator 40 drives the working fluid circulating in the liquid cooling device 200 via continuously generating fluid droplets D under EWOD efficiency. There is no noise generated during the operation of the liquid cooing device 200. Therefore, a quiet working environment is obtained. Moreover, there are many of fluid droplets D being simultaneously transferred towards the exit 491 of the droplet generator 40 from the entrance 481, which increases flow flux of the working fluid in the droplet generator 40 and thereby increases pump efficiency of the droplet generator 40 and flow rate of the working fluid in the liquid cooling device 200. The heat dissipation efficiency of the liquid cooling device 200 is therefore increased.

In the present liquid cooling device 200, the first and the second sealing blocks 48, 49, and the supporting members 46 are separately formed with the bottom electrode plate 42 and the top electrode plate 44. Alternatively, the first and the second sealing blocks 48, 49, and the supporting members 46 can be integrally formed with the bottom electrode plate 42 or the top electrode plate 44 as a single piece. If the first and the second sealing blocks 48, 49 are integrally formed with the bottom electrode plate 42, there is no need to define the first and the second openings 426, 427 in the bottom electrode plate 42. In the present liquid cooling device 200, the working fluid enters into and pours out of the droplet generator 40 respectively via the entrance 481 of the first sealing block 48 and the exit 491 of the second sealing block 49. Alternatively, the entrance 481 of the first sealing block 48 and the exit 491 of the second sealing block 49 can be omitted. In this situation, the working fluid can enter into and pour out of the droplet generator 40 via entrance and exit defined in the top electrode plate 44. In the present liquid cooling device 200, the top electrode plate 44 is supported on the bottom electrode plate 42 via the supporting members 46. Alternatively, the supporting members 46 can be canceled. In that situation, the top electrode plate 44 directly and hermetically contacts with the bottom electrode plate 42. The sub-channels 43 are defined in the bottom electrode plate 42, and the control electrodes 422 and the reference electrodes 442 are respectively embedded in the bottom electrode plate 42 and the top electrode plate 44.

Figure 8:
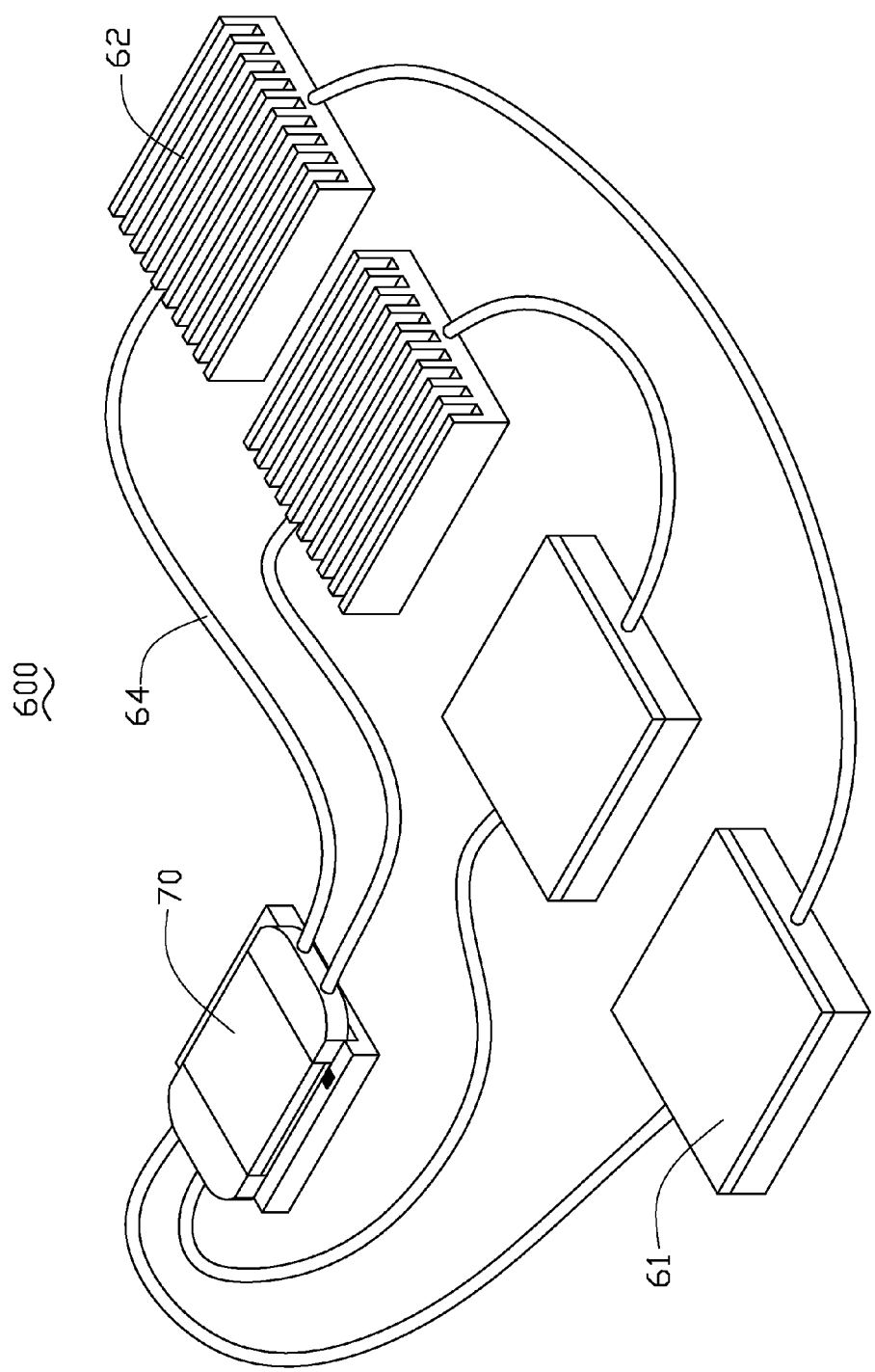
FIG. 8 is an assembled view of a miniaturized liquid cooling device in accordance with a second embodiment of the present invention.
Figure 9:
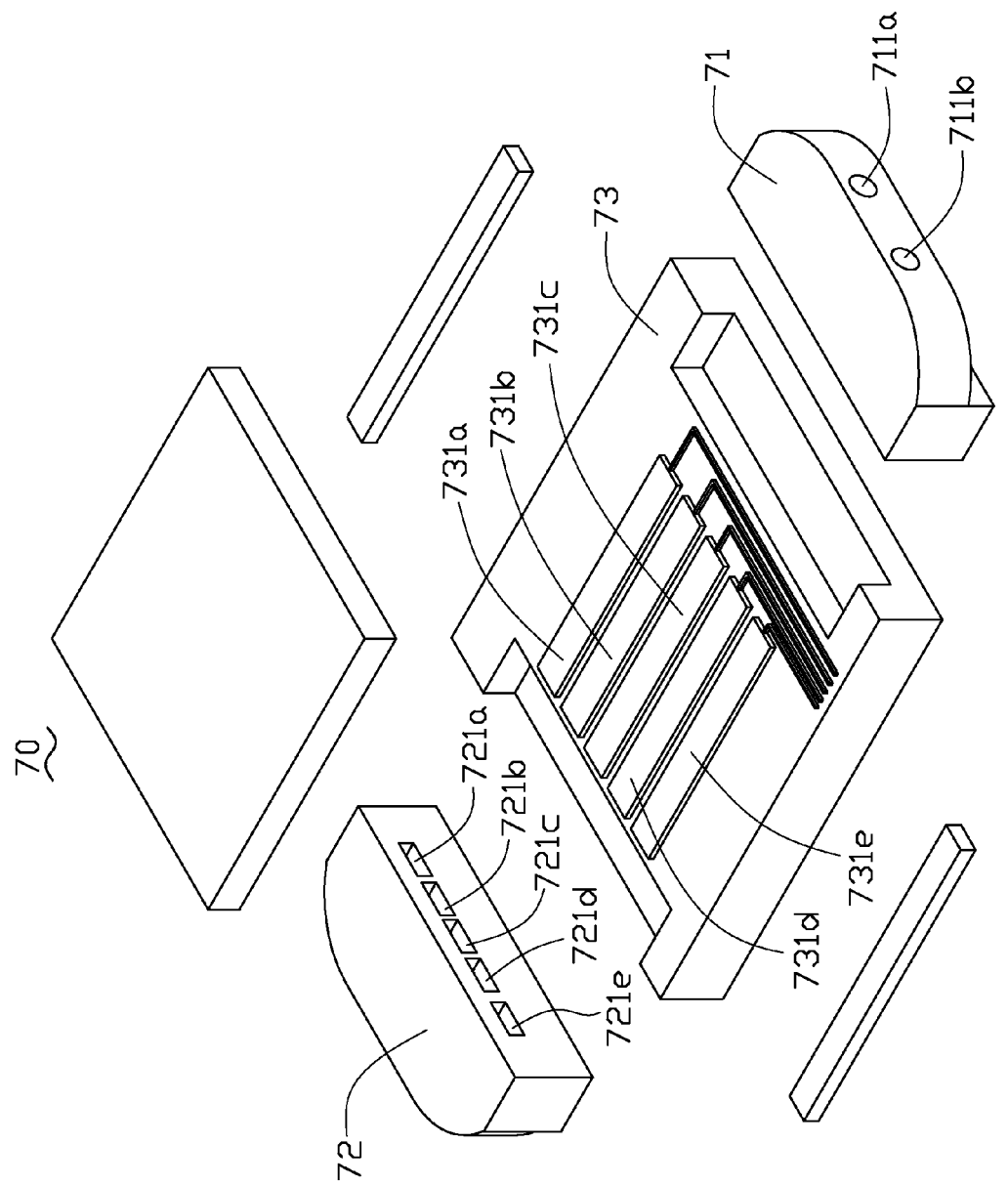
FIG. 9 is an exploded, isometric view of a droplet generator of the miniaturized liquid cooling device of FIG. 8.

Referring to FIG. 9, a droplet generator 70 of a second embodiment of the present liquid cooling device is shown. The entrance defined in the first sealing block 71 of the droplet generator 70 has two round outer openings 711a, 711b and five rectangular inner openings (not shown) corresponding to the control electrodes 731a, 731b, 731c, 731d, 731e. The exit defined in the second sealing block 72 of the droplet generator 70 has five rectangular inner openings 721a, 721b, 721c, 721d, 721e aligned with the inner openings of the entrance, and two round outer openings aligned with the outer openings 711a, 711b of the entrance. The aligned inner openings of the entrance and inner openings 721a, 721b, 721c, 721d, 721e of the exit are divided into two groups which respectively communicate with the aligned outer openings 711a, 711b of the entrance and outer openings of the exit. In this embodiment, the inner openings 721a, 721b and 721c communicate with the outer opening 711a, whilst the inner openings 721d and 721e communicate with the outer opening 711b. Alternatively, the inner openings 721a, 721b, 721c, 721d, 721e can be divided into two groups in other manners, or can be divided into more than two groups. Referring to FIG. 8, the liquid cooling device 600 includes two heat absorbers 61 and two heat dissipaters 62. The heat absorbers 61 and the heat dissipaters 62 are respectively connected with the outer openings 711a, 711b of the entrance and the outer openings of the exit via a plurality of tubes 64 so as two form two separated liquid circulation. The liquid cooling device 600 can simultaneously dissipate heat for two heat generating electronic components such as a CPU and a VGA (Video Graphic Array) card, which respectively contact with the two heat absorbers 61.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A droplet generator adapted for use in a liquid cooling device to cool at least a heat generating electronic component, the liquid cooling device having at least a heat absorber adapted for thermally connecting with the at least a heat generating electronic component and at least a heat dissipater adapted for dissipating heat generated by the at least a heat generating electronic component, the droplet generator being disposed between and communicating with the at least a heat absorber and the at least a heat dissipater and adapted for driving a working fluid to circulate in the liquid cooling device, the droplet generator comprising:
   a first electrode plate having an array of control electrodes;
   a second electrode plate hermetically covering the first electrode plate and having an array of reference electrodes crossed over the array of control electrodes;
   a fluid channel formed between the second electrode plate and the first electrode plate, said fluid channel having outer openings at opposite ends thereof adapted for respectively connecting with the at least a heat absorber and the at least a heat dissipater; and
   a plurality of superposed areas being formed between the control electrodes and the reference electrodes, voltages being regularly applied on the superposed areas for generating a plurality of fluid droplets and driving the fluid droplets to move along the fluid channel between the outer openings of the opposite ends of the droplet generator.

2. The droplet generator as described in claim 1, further comprising two sealing blocks hermetically disposed at the opposite ends thereof, the outer openings of the droplet generator being respectively defined in the sealing blocks.

3. The droplet generator as described in claim 2, wherein the sealing blocks each have an array of inner openings corresponding to the control electrodes of the first electrode plate.

4. The droplet generator as described in claim 1, further comprising two supporting members disposed at two opposite sides of the fluid channel and hermetically supporting the second electrode plate on the first electrode plate.

5. A miniaturized liquid cooling device comprising:
   at least a heat absorber;
   at least a heat dissipater;
   a droplet generator driving a working fluid circulating between the at least a heat absorber and the at least a heat dissipater, the droplet generator comprising a first electrode plate having an array of control electrodes; a second electrode plate hermetically covering the first electrode plate and having an array of reference electrodes crossed over the array of control electrodes; a fluid channel formed between the second electrode plate and the first electrode plate, said fluid channel having outer openings at opposite ends thereof adapted for respectively connecting with the at least a heat absorber and the at least a heat dissipater; and
   a plurality of superposed areas being formed between the control electrodes and the reference electrodes, voltages being regularly applied on the superposed areas for dividing the working fluid into fluid droplets when the working fluid flows through the droplet generator; and
   a plurality of tubes connecting the at least a heat absorber, the at least a heat dissipater and the droplet generator together to form a loop.

6. The miniaturized liquid cooling device as described in claim 5, wherein the droplet generator comprises two sealing blocks hermetically disposed at two opposite ends thereof, the droplet generator having entrance and exit being respectively defined in the sealing blocks, the fluid droplets being driven to flow towards the exit from the entrance.

7. The miniaturized liquid cooling device as described in claim 6, wherein the entrance has at least an outer opening connecting with the at least a heat dissipater, whilst the exit has at least an outer opening connecting with the at least a heat absorber.

8. The miniaturized liquid cooling device as described in claim 7, wherein the entrance has a plurality of inner openings corresponding to ends of the control electrodes and the exit has a plurality of inner openings corresponding to opposite ends of the control electrodes.

9. The miniaturized liquid cooling device as described in claim 5, wherein the droplet generator comprises a bottom electrode plate, a top electrode plate and two supporting members, the array of control electrodes being disposed on the bottom electrode plate, the array of reference electrode being disposed on the top electrode plate, the two supporting members hermetically supporting the top electrode plate on the bottom electrode plate and sandwiching the array of control electrodes therebetween.

* * * * *